United States Patent [19]

Tanaka et al.

[11] Patent Number: 4,884,241
[45] Date of Patent: Nov. 28, 1989

[54] NONVOLATILE SEMICONDUCTOR MEMORY DEVICE

[75] Inventors: Sumio Tanaka; Shigeru Atsumi, both of Tokyo; Shinji Saito, Yokohama, all of Japan

[73] Assignee: Kabushiki Kaisha Toshiba, Kawasaki, Japan

[21] Appl. No.: 330,040

[22] Filed: Mar. 29, 1989

[30] Foreign Application Priority Data

Mar. 31, 1988 [JP] Japan .................................. 63-78722

[51] Int. Cl.$^4$ .............................................. G11C 7/00
[52] U.S. Cl. ................................ 365/210; 365/189.09; 365/233.5
[58] Field of Search ................... 365/208, 210, 189.09, 365/233.5

[56] References Cited

U.S. PATENT DOCUMENTS 4,480,321  10/1984  Aoyama ........................... 365/233.5
4,661,928   4/1987  Yasuoka ........................... 365/233.5
4,758,995   7/1988  Sato .................................. 364/233.5

OTHER PUBLICATIONS

Saito et al., "A Programmable 80 ns 1 Mb CMOS EPROM," ISSCC Digest of Technical Papers, pp. 176–177, Feb. 1985.

Primary Examiner—James W. Moffitt
Attorney, Agent, or Firm—Finnegan, Henderson, Farabow, Garrett and Dunner

[57] ABSTRACT

A differential amplifier having input terminals connected to first and second nodes lying between the main nonvolatile memory cell section and the nonvolatile dummy cell circuit is used as a sense amplifier. The first and second nodes are pre-charged to a high potential level prior to the data readout operation. The memory cell section and the dummy cell circuit are set in the capacitively balanced condition, thereby making it possible to correctly read out data at a high speed.

6 Claims, 8 Drawing Sheets

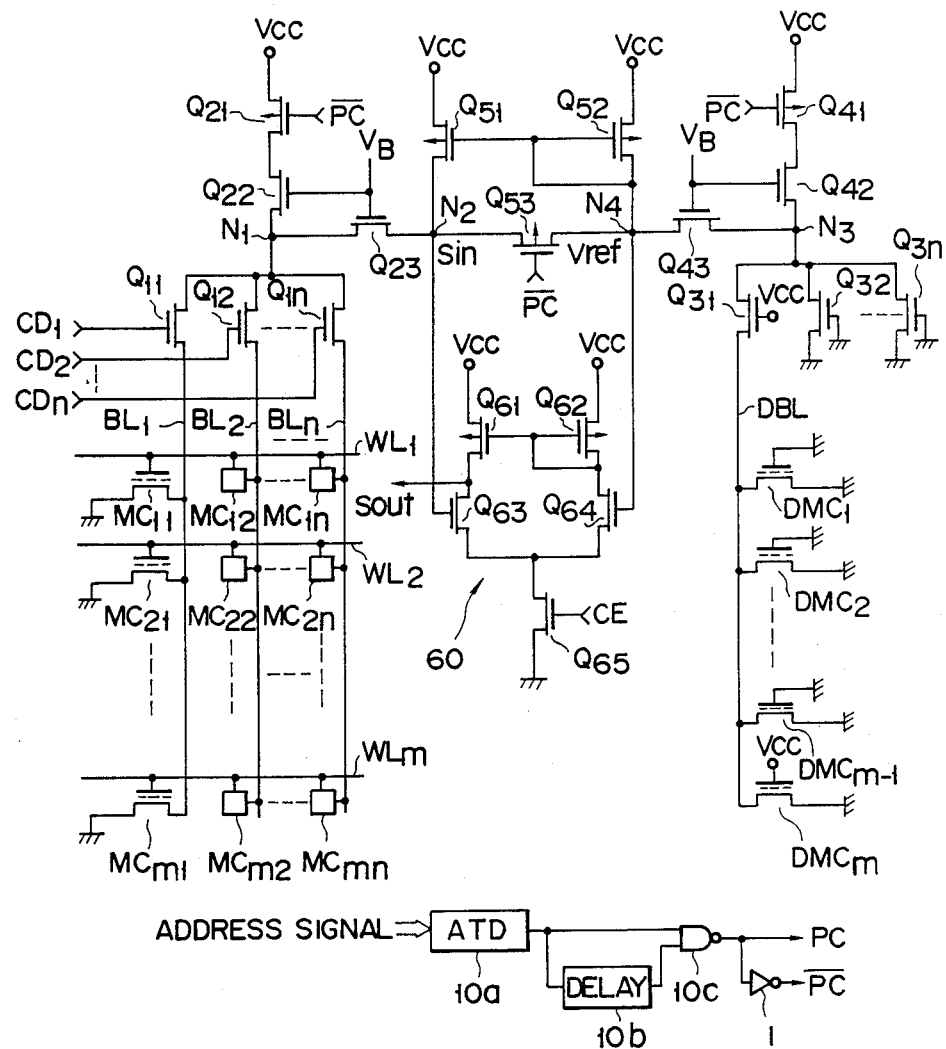
F I G. 4

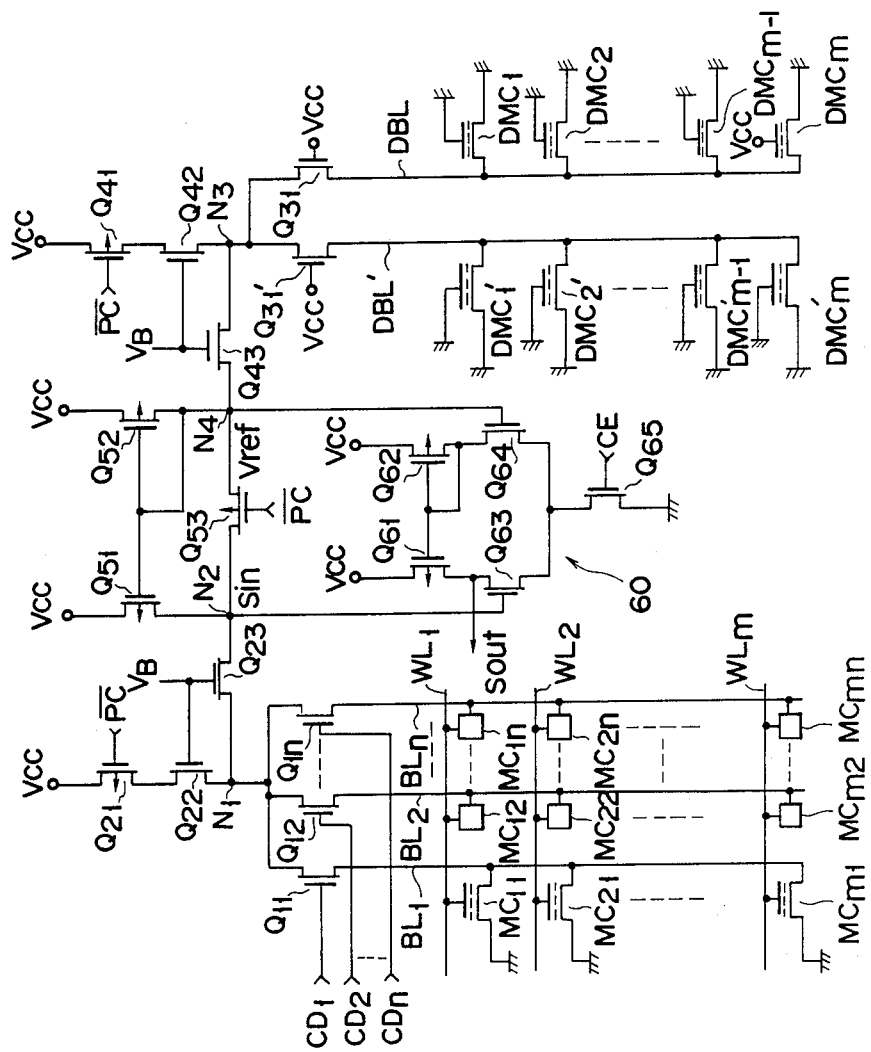
F I G. 7

NONVOLATILE SEMICONDUCTOR MEMORY DEVICE

BACKGROUND OF THE INVENTION

1. Field of the Invention

This invention relates to a nonvolatile semiconductor memory device, and more particularly to a nonvolatile semiconductor memory device having an improved data readout circuit.

2. Description of the Related Art

Generally, in the nonvolatile semiconductor memory device such as an EPROM, the potential of a bit line to which a selected memory cell is connected is compared with a reference potential created using a dummy cell and data of "1" or "0" is read out based on the comparison result.

The bit line potential varies according to data stored in the memory cell. That is, when data "0" is stored in the memory cell, the bit line potential is set and kept at a preset high potential level which has been precharged by means of a load circuit. In contrast, when data "1" is stored, the bit line is discharged via the cell transistor and the bit line potential is set to a low potential level. The reference potential is set at an intermediate potential level between the high and low potential levels of the bit line potential. Therefore, the result of comparison between the bit line potential and the reference potential will become different according to data stored in the memory cell so that data "0" or "1" can be read out.

However, in order to read out data "1" from the memory device of the above-described data readout system, the bit line potential must be lowered from the high potential level to the low potential level only through the discharging operation via the cell transistor. As a result, it takes a long time to read out data.

A nonvolatile semiconductor memory device shown in FIG. 1 is proposed to enhance the data readout speed. The memory device is disclosed in the document ("A Programmable 1Mb CMOS EPROM" ISSCC Digest of Technical Papers, pp. 176 to 177, 1985). The memory device is constructed such that bit line BL is precharged to an intermediate potential for a preset period of time by means of intermediate potential generating circuit 10 and then the potential of bit line BL is compared with that of dummy bit line DBL by means of sense amplifier 20.

In this case, as shown in FIG. 1, potential separation transfer gate transistors Q1 and Q2 are respectively connected between bit line BL and sense amplifier 20 and between dummy bit line DBL and sense amplifier 20. Therefore, sense amplifier 20 actually compares sense input signal Sin of node N1 supplied from a main circuit with reference potential Vref of node N2 on the dummy cell side.

Further, in the EPROM, address transition detecting circuit (ATD) 10a is used for generating pre-charging signal PC. In other words, when the transition of the memory address designated by the address signal is detected by means of ATD 10a, a pulse signal of a preset pulse width is supplied via delay circuit 10b and NAND gate 10c and used as pre-charging signal PC.

If the potential of bit line BL is set to the intermediate potential, it is only necessary to lower the bit line potential from the intermediate potential level to the low potential level when data "1" is read out. As a result, the data readout speed becomes high in comparison with the case where the bit line potential is lowered from the high potential level to the low potential level.

However, in the EPROM, as shown in FIGS. 2 and 3, sense amplifier input signal Sin will sway or fluctuate in a short period after pre-charging signal PC is reset, and it takes some time until data is determined.

FIG. 2 is a waveform diagram showing the readout operation in a case where data "1" is stored in memory cell MC. Theoretically, sense input signal Sin will start to be lowered at time t0 at which pre-charging signal PC has been changed from "1" to "0". Actually, however, as shown in FIG. 2, sense signal Sin fluctuates in period T1 from t0 to t1 and the potential level thereof is first raised and then lowered. Therefore, the readout data cannot be determined until period T1 from rising time t0 of pre-charging signal PC has elapsed.

Further, as shown in FIG. 3, in a case where data "0" is stored in selected memory cell MC, sense signal Sin will fluctuate in period T2 from rising time t0 of pre-charging signal PC to time t2.

The fluctuation in sense signal Sin is caused by setting of the potential of bit line BL to the intermediate potential level. During the fluctuation in the potential, it is practically impossible to correctly read out data, and as a result, the data readout speed is lowered.

SUMMARY OF THE INVENTION

This invention has been made in consideration of the above fact, and an object thereof is to provide a nonvolatile semiconductor memory device capable of preventing the sense input signal from fluctuating, thereby permitting data to be correctly read out at a high speed.

A nonvolatile semiconductor memory device comprises bit lines, a first load circuit connected to said bit lines to charge them to a potential, nonvolatile memory cells connected to said bit lines, a first transfer gate transistor which is connected between said bit lines and a first node and whose gate is supplied with a preset bias voltage, a second load circuit connected to said first node to charge the same, at least one dummy bit line, a third load circuit connected to said dummy bit line to charge the same, dummy cells connected to said dummy bit line, a second transfer gate transistor which is connected between said dummy bit line and a second node and whose gate is supplied with the preset bias voltage, a fourth load circuit having a current supplying ability higher than said second load circuit, connected to said second node to charge the same, an equalizing circuit for equalizing potentials of said first and second nodes in a non-readout period in which stored data is not read out, and a sense amplifier for comparing the potential of said first node with that of said second node, and amplifying and supplying the difference therebetween in a data readout period, wherein substantially the same capacitance as that associated with said bit line is provided for said dummy bit line.

(OPERATION)

In the nonvolatile semiconductor memory device of the above construction, the bit lines and the dummy bit line are respectively charged by means of the first and third load circuits. When they are sufficiently charged, the charging operation of the first and third load circuits is completed. As a result, the dummy bit line is discharged via the dummy cell and the potential thereof is lowered. When the stored data of the memory cell is "1", the bit line is discharged via the memory cell and the potential thereof is also lowered. Since, in this case, the fourth load circuit has a current supplying ability higher than the second load circuit, the rate of decrease in the potential of the first node is higher than that in the potential of the second load circuit. Further, when data of the memory cell is "0", the bit line potential is kept unchanged and the potential of the first node is set to be higher than that of the second node. As a result, a relatively large difference occurs between the first and second node potentials, thus making it possible to read out data at a high speed. In addition, since the bit lines and the dummy bit line are charged by the potential voltage and set to a preset high potential level instead of being previously charged to an intermediate potential of the logical amplitude, the potential of the first node or the sense input signal will not fluctuate.

BRIEF DESCRIPTION OF THE DRAWINGS

FIG. 4 is a circuit diagram showing the construction of a data readout circuit of a nonvolatile semiconductor memory device according to one embodiment of this invention;

FIG. 7 is a circuit of a modification of the embodiment shown in FIG. 4; and

DETAILED DESCRIPTION OF THE PREFERRED EMBODIMENTS

Figure 1:
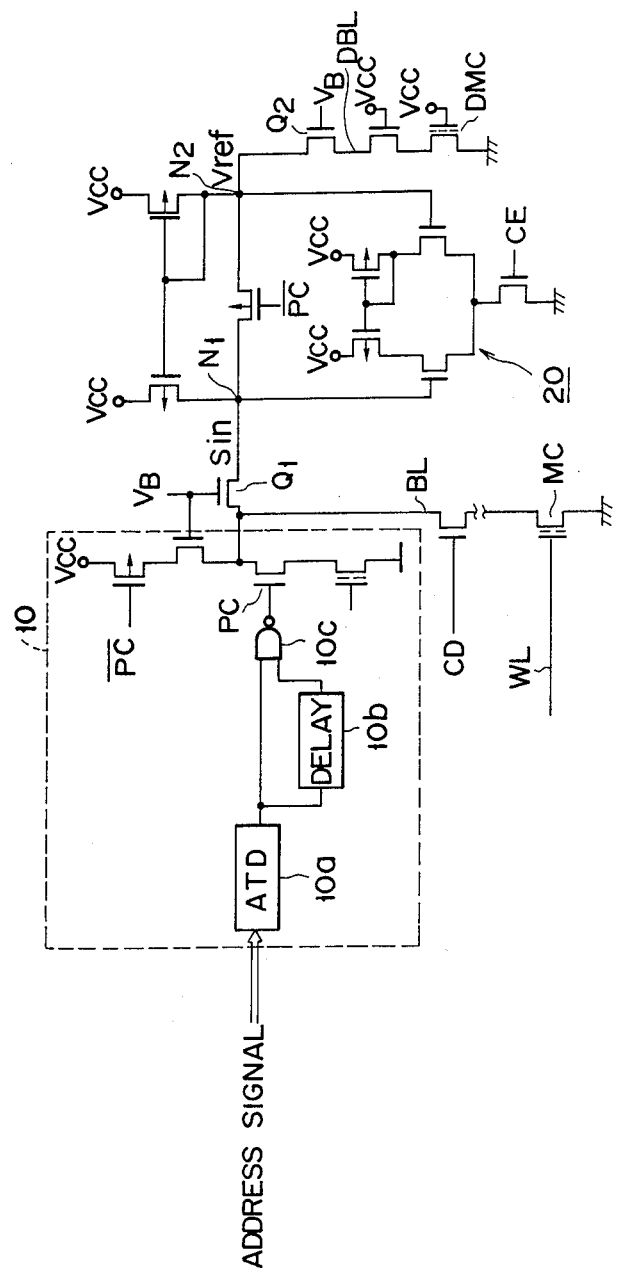
FIG. 1 is a circuit diagram showing the construction of a data readout circuit of the conventional nonvolatile semiconductor memory device.
Figure 2:
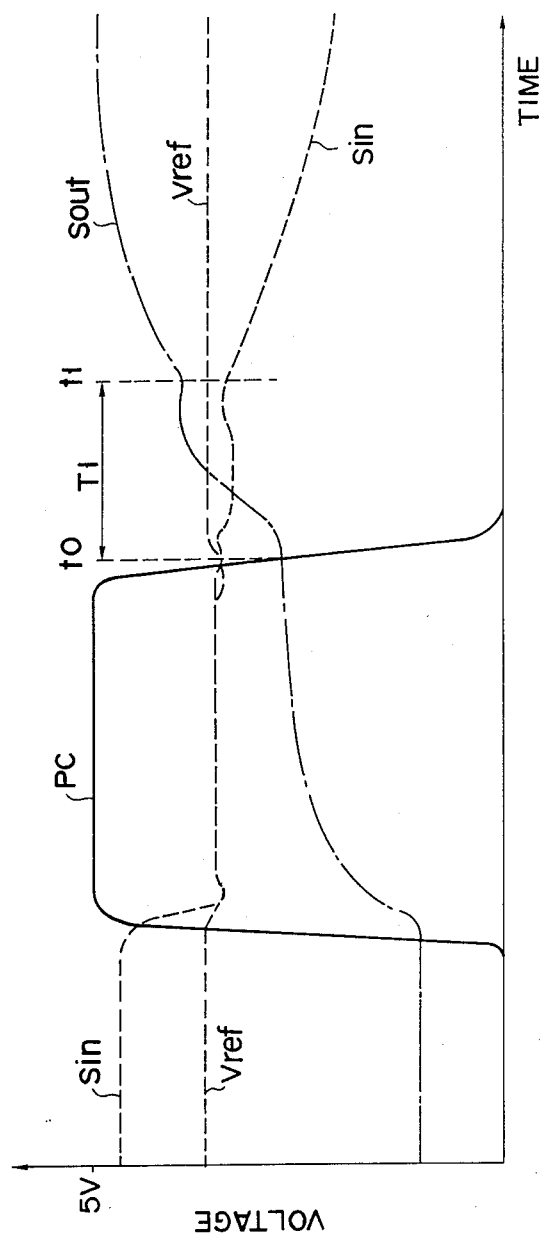
FIGS. 2 and 3 are waveform diagrams illustrating the operation of the circuit of FIG. 1 in a case where data "1" and "0" are read out.
Figure 3:
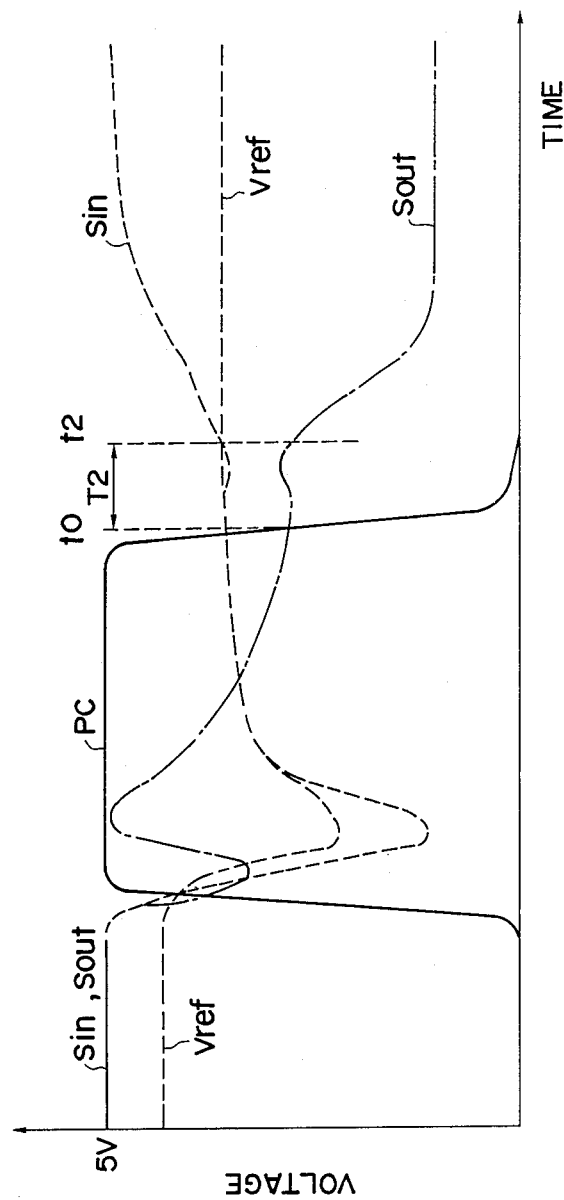

There will now be described embodiments of this invention with reference to the accompanying drawings.

FIG. 4 shows the construction of a data readout circuit of an EPROM according to one embodiment of this invention. The data readout operation of the EPROM is effected in the same manner as in the conventional EPROM of FIG. 1. That is, the potential of sense input signal Sin created according to the data stored in a selected one of memory cells MC11 to MCmn of the main circuit and appearing on node N2 is compared with reference potential Vref created by the dummy cell and appearing on node N4 by means of sense amplifier 60. Data is determined based on the relative difference between the compared potentials. In this case, in the pre-charging period, the bit line and the dummy bit line are set not to the intermediate potential but to a preset high level potential and the potentials thereof are equalized. Then, in the data readout mode, the relative potential difference between sense input signal Sin and reference potential Vref is detected and amplified.

Now, the construction of the EPROM is explained in more detail. The EPROM has a data programming circuit, but it is omitted for clarifying the explanation.

The main circuit has nonvolatile semiconductor memory cells MC11 to MCmn respectively arranged in position at which n bit lines BL1 to BLn and m word lines WL1 to WLm intersect each other. Each of the memory cells is formed of double gate MOS transistor, for example.

Bit lines BL1 to BLn are respectively connected in series with column selection N-channel MOS transistors Q11 to Q1n. The gates of MOS transistors Q11 to Q1n are supplied with decoded signals CD1 to CDn which are output from a column decoder (not shown).

P-channel MOS transistor Q21 and N-channel MOS transistor Q22 are serially connected as a load circuit for bit lines BL1 to BLn between commonly connected ends of bit lines BL1 to BLn or node N1 and a power source Vcc terminal. The gate of transistor Q21 is supplied with pre-charging signal PC which is set at "0" level in the pre-charging period. The gate of transistor Q22 is supplied with bias voltage $V_B$ which is smaller than power source voltage Vcc, and transistor Q22 is kept conductive. Bias voltage $V_B$ is generated from a bias voltage generating circuit (not shown).

In the pre-charging period in which pre-charging signal PC is set at "0" level, transistor Q21 is set in the conductive state so that bit lines BL1 to BLn can be charged via transistors Q21 and Q22 to a preset high level potential in the pre-charging period. The preset high level potential is theoretically set at approx. 2 V ($=V_B-V$th) when, for example, power source potential Vcc is 5 V, bias voltage $V_B$ is 3 V and threshold voltage Vth of transistor Q22 is 1 V. Actually, however, it is set at approx. 1 V because of the influence of the substrate bias effect.

N-channel MOS transistor Q23 is connected as a potential separation transfer gate between node N1 and input node N2 of sense amplifier 60, and the gate of transistor Q23 is supplied with bias voltage $V_B$. P-channel MOS transistor Q51 normally kept in the conductive state is connected between node N2 and the power source Vcc terminal, and acts as a load for charging node N2.

In the dummy cell section in which reference potential Vref is created, dummy bit line DBL is connected to m dummy cells DMC1 to DMCm the number of which is the same as that of those memory cells which are connected to one bit line BL. Each of the dummy cells may be formed with the same structure as the memory cell or double gate type MOS transistor, for example.

Dummy cells DMC1 to DMCm are transistors in which no electrons are injected into the floating gate thereof. The gates of dummy cells DMC1 to DMCm-1 are set at the ground potential, and the gate of dummy cell DMCm is connected to the power source Vcc terminal. Therefore, only dummy cell DMCm is set in the conductive state, and the other dummy cells are set in the nonconductive state.

N-channel MOS transistor Q31 having a gate connected to the power source Vcc terminal and normally kept in the conductive state is inserted in dummy bit line DBL, and N-channel MOS transistors Q32 to Q3n are connected to one end of dummy bit line DBL or node N3. The gates of transistors Q32 to Q3n are connected to the ground terminal, and therefore transistors Q32 to Q3n are normally kept in the nonconductive state. As a result, the capacitance associated with dummy bit line DBL by the presence of transistors Q32 to Q3n and dummy cells DMC1 to DMCm becomes substantially equal to that associated with one bit line selected by the column decoder.

P-channel MOS transistor Q41 and N-channel MOS transistor Q42 acting as a load for dummy bit line DBL are connected in series between node N3 and the power source Vcc terminal. The gate of transistor Q41 is supplied with pre-charging signal PC which is set at "0" level in the pre-charging period, and the gate of transistor Q42 is supplied with bias voltage VB lower than power source voltage Vcc.

In the pre-charging period in which pre-charging signal PC is set at "0" level, transistor Q41 is set in the conductive state so that dummy bit line DBL may be charged to a preset high potential level by means of transistors Q41 and Q42 in the pre-charging period.

N-channel MOS transistor Q43 is connected as a potential separation transfer gate between node N3 and the other input node N2 of sense amplifier 60, and the gate of transistor Q43 is supplied with bias voltage VB, P-channel MOS transistor Q52 normally kept in the conductive state is connected between node N4 and the power source Vcc terminal, and acts as a load for charging node N4. The current supplying ability of transistor Q52 is set to be higher than that of transistor Q51 for charging node N2, and the gates of transistors Q51 and Q52 are commonly connected to the drain of transistor Q52.

P-channel MOS transistor Q53 is connected between nodes N2 and N4, and the gate thereof is supplied with pre-charging signal PC. As a result, the potentials of nodes N2 and N4 are equalized by means of transistor Q53 in the pre-charging period.

The potential of node N2 is supplied as sense input signal Sin to sense amplifier 60 which in turn compares signal Sin with the potential of node N4 or reference potential Vref and produces output signal Sout corresponding to the relative difference between the two input potentials.

That is, as shown in FIG. 4, sense amplifier 60 can be formed of an ordinary differential amplifier including P-channel MOS transistors Q61 and Q62 and N-channel MOS transistors Q63 to Q65. The gate of transistor Q65 acting as the current source of the differential amplifier is supplied with chip enable signal CE. Therefore, sense amplifier 69 can be operated only in a period in which the chip enable signal is set in the active state and the operation of sense amplifier 60 can be interrupted in the other period so as to prevent a penetration current from flowing between the power source terminals.

It is preferable to use address transition detecting circuit 10 which is explained with reference to FIG. 1 in order to generate pre-charging signal PC. In other words, The EPROM is provided with address transition circuit 10 for detecting change of an externally supplied address signal and a pulse generation circuit (10b, 10c) for generating a pulse signal of a preset pulse width in response to the output of detecting circuit 10, and the pulse signal is used as a pre-charging signal. With this construction, the pre-charging operation can be automatically effected in a period in which the operation of decoding the address signal by means of the row and column decoders is effected. Thus, the access time in the data readout mode can be reduced.

Now, the data readout operation of the EPROM will be explained with reference to FIGS. 5 and 6.

Figure 5:
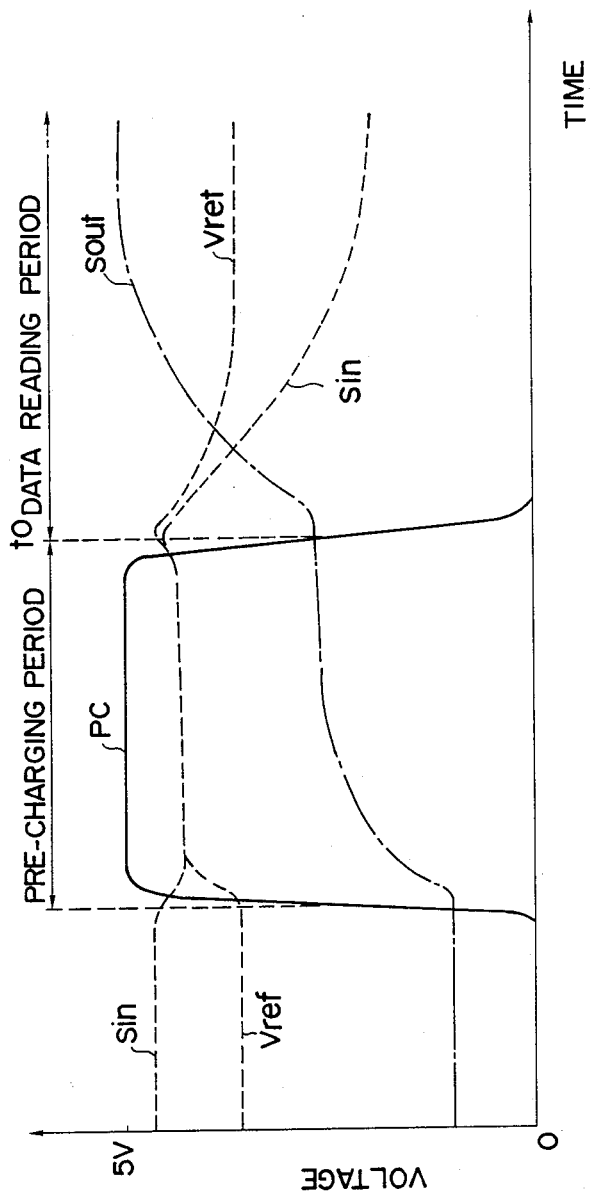
FIGS. 5 and 6 are waveform diagrams illustrating the operation of the circuit of FIG. 4 in a case where data "1" and "0" are read out.

FIG. 5 is a waveform diagram illustrating the operation in a case where a memory cell having memory data of "1" is selected. In the pre-charging period in which the pre-charging signal PC is set at "1" level (PC is set at "0" level), sense input signal Sin and reference potential Vref are equalized with each other and are both set to the same potential by means of transistor Q53. As a result, in the pre-charging period, output signal Sout of sense amplifier 60 is set at an intermediate potential between "1" level (5 V) and "0" level (0 V).

After the end of the pre-charging period, PC is set to "1" level, and the charging operation of the bit line by means of transistors Q21 and Q22 is interrupted. At the same time, the charging operation of the dummy bit line by means of transistors Q41 and Q42 is also interrupted. As a result, the potential of node N1 is lowered through the discharging by means of a selected memory cell, and the potential of node N3 is lowered through the discharging by means of dummy cell DMCm.

With the fall of the potentials of node N1 and N3, the potential levels of sense input signal Sin and reference potential Vref are also lowered. In this case, since the current supplying ability of transistor Q52 is set to be higher than that of transistor Q51, the potential level of sense input signal Sin falls at a rate higher than that of reference potential Vref. Therefore, a relative potential difference between sense input signal Sin and reference potential Vref occurs at time t0 at which the pre-charging period is completed, thus making it possible to effect the data readout operation at a higher speed and reliability in comparison with the conventional case. Since, in this case, bit lines BL1 to BLn are charged not to an intermediate potential but to a high potential level and then discharged via the memory cell, fluctuation in sense input signal Sin in which the potential first rises and then falls as in the conventional case can be suppressed.

Figure 6:
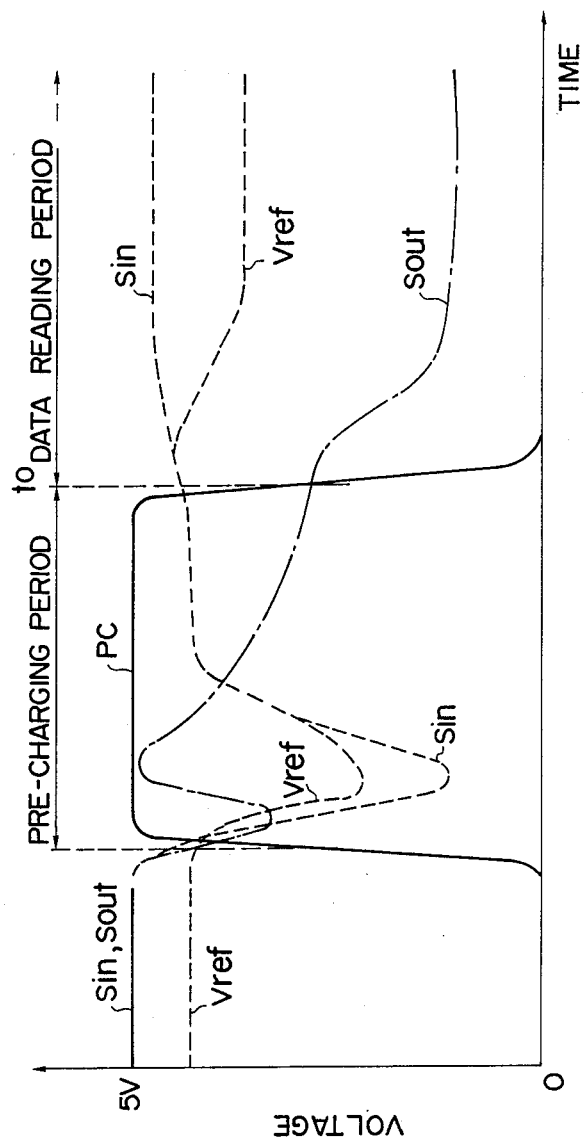

FIG. 6 is a waveform diagram illustrating the operation in a case where a memory cell having memory data of "0" is selected. In the pre-charging period in which the pre-charging signal PC is set at "1" level (PC is set at "0" level), sense input signal Sin and reference potential Vref are equalized with each other and are both set to the same potential by means of transistor Q53. After the end of the pre-charging period, the charging operation of the bit line by means of transistors Q21 and Q22 is interrupted and the charging operation of the dummy bit line by means of transistors Q41 and Q42 is also interrupted. Since, in this case, the memory data of the selected memory cell is "0", the potential of node N1 is kept unchanged and the potential of node N3 is lowered through the discharging by means of dummy cell DMCm. As a result, a relative potential difference between sense input signal Sin and reference potential Vin will occur immediately after time t0 as shown in FIG. 6 without incurring fluctuation in sense input signal Sin. Also, in this case, data readout can be effected at a high speed and reliability.

In the embodiment of FIG. 4, the capacitance of dummy bit line DBL connected to dummy cells DMCl to DMCm is set to be substantially equal to that of each of bit lines BL1 to BLn, and the capacitances of column selection transistors Q11 to Q1n are set to be substantially equal to those of transistors Q31 to Q3n, respectively. However, the capacitance balance can also be attained by other means.

FIG. 7 shows an example of such capacitance balancing means. In this case, the capacitance corresponding to a selected bit line of the main memory section is set by means of the dummy memory cells connected to dummy bit line DBL, and the capacitances corresponding to column selection transistors Q11 to Q1n are set by means of dummy cells DMC'1 to DMC'm connected to second dummy bit line DBL' which is formed with the same structure as dummy bit line DBL and connected in parallel with dummy bit line DBL. In the embodiment of FIG. 7, the capacitance balance can be attained only by use of the dummy cells formed with the same structure as the memory cells in the main memory section, and transistors Q32 to Q3n used in the embodiment of FIG. 4 can be omitted. Therefore, the design of a pattern formed on the chip can be simplified in comparison with the case of the embodiment shown in FIG. 4. The other portions of the circuit of FIG. 7 are the same as those of the circuit of FIG. 4, except for the gate of the last cell DMC'm which is grounded, and therefore the construction and operation of the circuit are omitted here.

Figure 8:
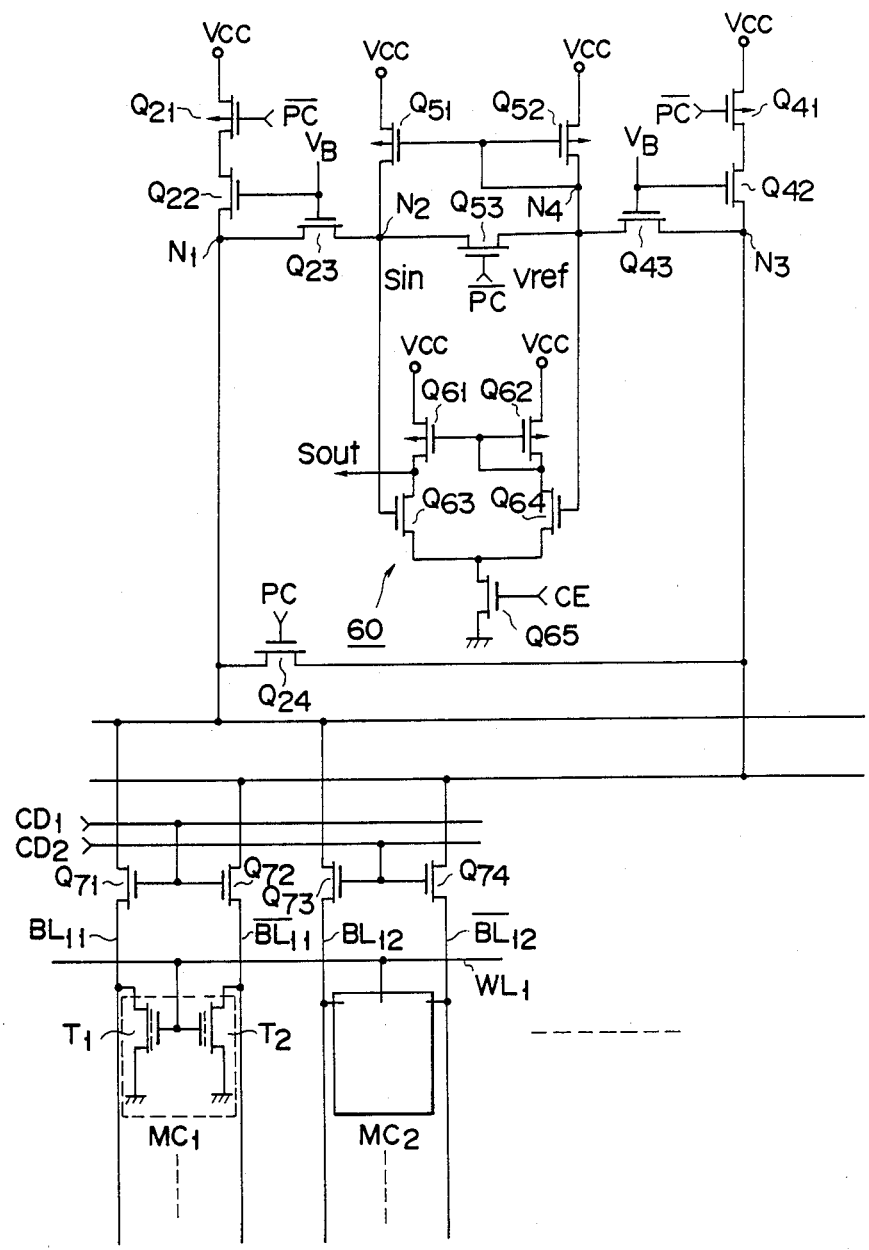
FIG. 8 is a circuit diagram showing the construction of a circuit according to another embodiment of this invention.

FIG. 8 shows a case wherein this invention is applied to 2-transistor cell type EPROM. In FIG. 8, portions which correspond to those in the circuit of FIG. 4 are denoted by the same reference numerals. In this embodiment, the readout operation is effected by comparing the potentials of paired bit lines. For example, bit line BLl1 is connected to node N1 via N-channel MOS transistor Q71, and bit line BLl1 is connected to node N3 via N-channel MOS transistor Q72. The conduction states of transistors Q71 and Q72 are controlled by decoded signal CD1. Likewise, bit line BL12 on the second column is connected to node N1 via N-channel MOS transistor Q73, and bit line BL12 is connected to node N3 via N-channel MOS transistor Q74. The conduction states of transistors Q73 and Q74 are controlled by decoded signal CD2.

As shown in FIG. 8, memory cell MC1 is constructed by two two-layered MOS transistors T1 and T2 whose control gates are commonly connected to word line WL1. The drains of transistors T1 and T2 are respectively connected to bit lines BLl1 and BLl1. With this construction, transistor T2 corresponds to dummy cell DMC1 in the circuit of FIG. 4, and no electron is injected into the floating gate of transistor T2 to keep data "1" stored therein. Memory cell MC2 connected to word line WL1 is formed with the same structure as memory cell MC1.

With the 2-transistor cell structure, since the capacitance associated with node N1 can be set to be equal to that associated with node N3, the potential variation of sense input signal Sin in the readout mode can be made more stable than in the case of the circuit of FIG. 4, thus suppressing the fluctuation in the potential variation to a minimum. In addition, since the dimensions of the transistors $Q_{51}$ and $Q_{52}$ can also be taken approximately equal with the 2-transistor cell structure, potentials of nodes N1 and N3 can also be equalized by the n-channel transistor $Q_{24}$, thus accelerating the equalization speed for higher access time.

In the above explanation, the peripheral circuit is formed of CMOS circuits, but it can be formed of NMOS circuits.

As described above, according to this invention, fluctuation in the sense input signal can be effectively suppressed and data can be read out at a high speed.

What is claimed is:

1. A nonvolatile semiconductor memory device comprising:
   bit lines;
   a first load circuit connected to said bit lines to charge them to a potential;
   nonvolatile memory cells connected to said bit lines;
   a first transfer gate transistor which is connected between said bit lines and a first node and whose gate is supplied with a preset bias voltage;
   a second load circuit connected to said first node to charge the same;
   at least one dummy bit line;
   a third load circuit connected to said dummy bit line to charge the same;
   dummy cells connected to said dummy bit line;
   a second transfer gate transistor which is connected between said dummy bit line and a second node and whose gate is supplied with the preset bias voltage;
   a fourth load circuit having a current supplying ability higher than said second load circuit, connected to said second node to charge the same;
   an equalizing circuit for equalizing potentials of said first and second nodes in a non-readout period in which stored data is not read out; and
   a sense amplifier for comparing the potential of said first node with that of said second node, and amplifying and supplying the difference therebetween in a data readout period, wherein substantially the same capacitance as that associated with said bit line is provided for said dummy bit line.

2. A nonvolatile semiconductor memory device according to claim 1, further comprising a detection circuit for detecting a change of an address signal; and a pulse generation circuit for generating a pulse signal of a preset pulse width in response to an output of said detection circuit; wherein the pulse signal is used setting the non-readout period during which stored data is not read out.

3. A nonvolatile semiconductor memory device according to claim 1, wherein said bit line is connected to a plurality of nonvolatile memory cells, said dummy bit line is connected to dummy cells of the same number as that of said nonvolatile memory cells, and one of said dummy cells lowers the potential of said dummy bit line in the data readout period.

4. A nonvolatile semiconductor memory device according to claim 1, wherein a memory element is constituted by a pair of nonvolatile memory cell and a dummy cell, each of the memory cell and dummy cell having a control gate connected to a common word line.

5. A nonvolatile semiconductor memory device according to claim 4, which further comprises a transistor connected between said bit lines and dummy bit line to equalize potentials of said bit lines and dummy bit line in the non-readout period.

6. A nonvolatile semiconductor memory device according to claim 1, wherein said dummy bit line is connected to a group of dummy cells providing substantially the same capacitance as that provided by the memory cells connected to said bit line;
   each of said bit lines is connected in series with a column selection transistor;
   a second dummy bit line is additionally connected in parallel with said dummy bit line; and
   said dummy bit line is connected to a group of second dummy cells providing a capacitance corresponding to said column selection transistor.

* * * * *